US012593421B2

(12) United States Patent
Lin

(10) Patent No.: US 12,593,421 B2
(45) Date of Patent: Mar. 31, 2026

(54) CARRIER, CABINET, AND SERVER

(71) Applicant: Fulian Precision Electronics (Tianjin) Co., LTD., Tianjin (CN)

(72) Inventor: Jia-Feng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 98 days.

(21) Appl. No.: 18/674,712

(22) Filed: May 24, 2024

(65) Prior Publication Data

US 2025/0024626 A1     Jan. 16, 2025

(30) Foreign Application Priority Data

Jul. 12, 2023     (CN) .......................... 202310864163.3

(51) Int. Cl.
*H05K 7/14* (2006.01)
*H05K 7/20* (2006.01)

(52) U.S. Cl.
CPC ......... *H05K 7/1489* (2013.01); *H05K 7/1402* (2013.01); *H05K 7/2039* (2013.01)

(58) Field of Classification Search
None
See application file for complete search history.

(56) References Cited

U.S. PATENT DOCUMENTS 6,227,630 B1 * 5/2001 Brown ................. H05K 7/1405
6,373,696 B1 * 4/2002 Bolognia ............. G11B 33/128

7,012,803 B1 * 3/2006 Austin .................... G06F 1/184
                                           361/679.33
9,524,006 B2 * 12/2016 Nishio .................... G06F 1/187
10,401,922 B2 * 9/2019 Ehlen ..................... G06F 1/187
2003/0011978 A1 * 1/2003 Moore .................... G06F 1/183
                                           361/679.58
2009/0149044 A1 * 6/2009 Lee ...................... G11B 33/121
                                           439/372
2012/0162894 A1 * 6/2012 Lin .......................... G06F 1/187
                                           361/679.31
2017/0329373 A1 * 11/2017 Ehlen .................... G11B 33/124
2024/0064923 A1 * 2/2024 Lin .......................... G06F 1/187

FOREIGN PATENT DOCUMENTS

CN        107728729 A      2/2018
CN        215181755 U      12/2021
TW        200930247 A      7/2009

* cited by examiner

*Primary Examiner* — James Wu
*Assistant Examiner* — Christopher L Augustin
(74) *Attorney, Agent, or Firm* — ScienBiziP, P.C.

(57) ABSTRACT

A carrier for carrying a hard drive comprises a shell, a sliding bracket, and a spring. The sliding bracket is placed in the shell and is slidable relative to the shell, and the sliding bracket is configured for holding the hard drive. The spring is connected to the shell and the sliding bracket, and the spring is configured for pushing the sliding bracket. When the carrier is inserted into a cabinet, the spring pushes the sliding bracket to a connector of the cabinet to connect the hard drive to the connector. A cabinet comprises a chassis, a shelf, and a plurality of the carriers. The chassis is used for accommodating a circuit board with connectors. The shelf is placed in the chassis. Each connector is used for connecting the hard drive held in each carrier. A server with the carrier is also disclosed.

17 Claims, 8 Drawing Sheets

30

313

32

33

314

311

312

34

31

31

CARRIER, CABINET, AND SERVER

FIELD

The disclosure herein generally relates to information computing systems, and more particularly relates to a carrier for carrying a hard drive, a cabinet, and a server.

BACKGROUND

Usually, a hard disk is carried by a carrier for installing to a server. However, when installing a hard disk to a server, due to manufacturing errors or tolerances, the contact between the hard disk and the connector of the circuit board sometimes is poor, causing the hard disk to be unreadable.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
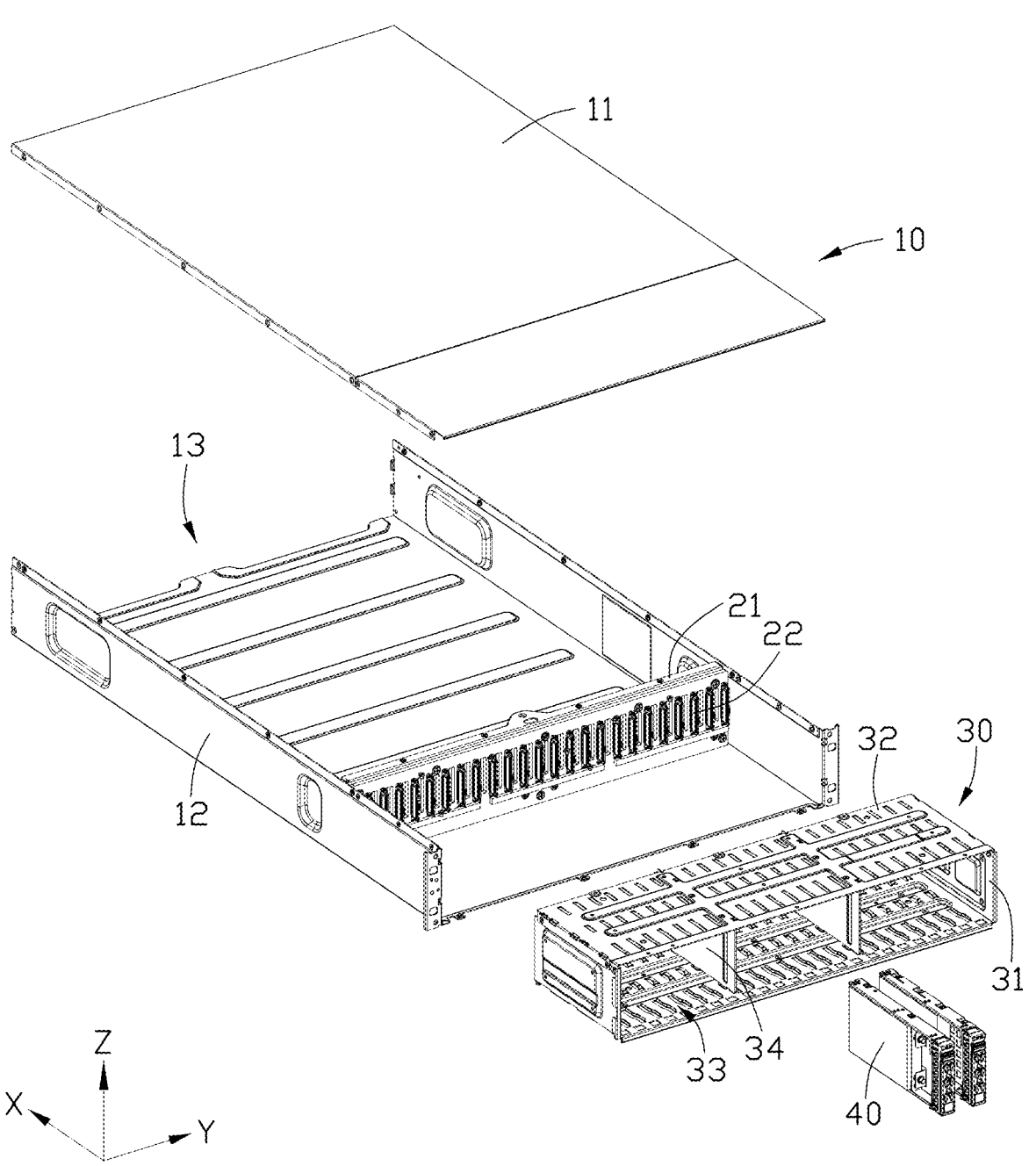
FIG. 1 is an exploded view of an embodiment of a cabinet of a server according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1, a server 200 in an embodiment includes a cabinet 100 and a circuit board 21 with a plurality of connectors 22. Each of the connectors 22 is used for connecting a hard drive 41.

The cabinet 100 includes a chassis 10, a shelf 30, and a plurality of carriers 40. The chassis 10 includes a case 12 and a cover 11, and a cavity 13 is formed between the case 12 and the cover 11. The circuit board 21 and the shelf 30 are placed in the cavity 13, so the chassis 10 protects the circuit board 21 and the shelf 30.

The circuit board 21 is located beside the shelf 30. The carriers 40 insert into the shelf 30 in a first direction X. Each carrier 40 is used for holding a hard drive 41. The hard drive 41 includes a port 411 and a main body 412. The port 411 is used for connecting the connector 22.

In some embodiments, the connectors 22 are arranged in a second direction Y, and the second direction Y is perpendicular to the first direction X.

Figure 2:
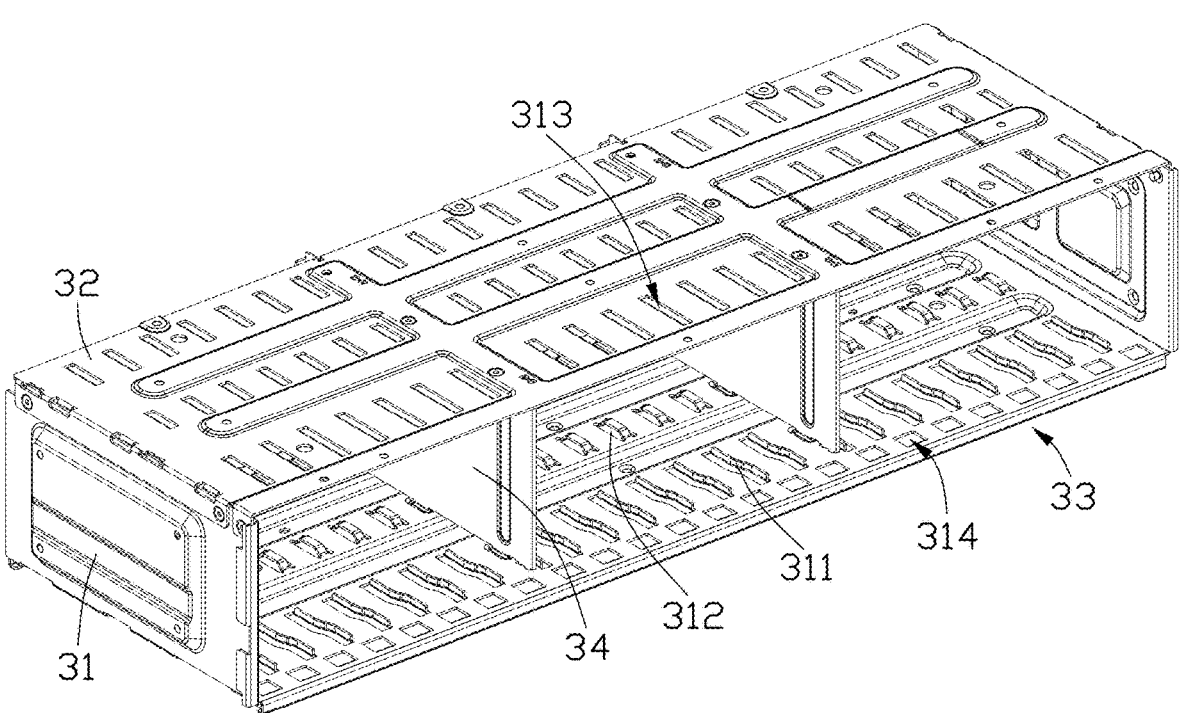
FIG. 2 is an isometric view of a shelf of the cabinet shown in FIG. 1.
Figure 2:
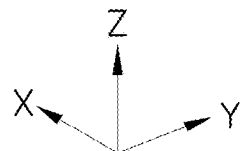

As shown in FIG. 2, in some embodiments, the shelf 30 includes a bottom sheet 31 and a top sheet 32. A space 33 is formed between the bottom sheet 31 and a top sheet 32 and the space 33 is open in the first direction X. The bottom sheet 31 and the top sheet 32 can limit the carriers 40 in a third direction Z, and the third direction Z is perpendicular to the first direction X and the second direction Y.

In some embodiments, the shelf 30 has several partition boards 34. The partition boards 34 are removably mounted between the top sheet 32 and the bottom sheet 31 to divide the space 33 into multiple areas. On the one hand, multiple areas can avoid heat accumulation. On the other hand, the carriers 40 in each area can be classified to facilitate the identification of the carriers 40.

In some embodiments, there are two partition boards 34 in the shelf 30 to divide the space 33 into three areas.

As shown in FIG. 2, in some embodiments, the bottom sheet 31 has a plurality of division sheets 311 in the space 33. The division sheets 311 are arranged in the second direction Y. Each two adjacent division sheets 311 are used for limiting one carrier 40 therein between, improving the stability of the carriers 40.

In some embodiments, the bottom sheet 31 has protrusions 312, and each protrusion 312 is aligned with each division sheet 311 in the first direction X. Each two adjacent protrusions 312 are used for limiting one carrier 40 therein between, further improving the stability of the carriers 40.

In some embodiments, the division sheet 311 and the protrusion 312 are formed by stamping the bottom sheet 31. The bottom sheet 31 has stamping holes on the locations of the division sheets 311 and the protrusions 312, and the stamping holes can help to dissipate heat of the space 33.

In some embodiments, the top sheet 32 has ribs 313 protruded from the top sheet 32 to the bottom sheet 31. Each rib 313 is aligned with each division sheet 311 and each protrusion 312 in the third direction Z. Each two adjacent ribs 313 are used for limiting one carrier 40 therein between, further improving the stability of the carriers 40.

In some embodiments, the ribs 313 are formed by stamping the top sheet 32.

Figure 3:
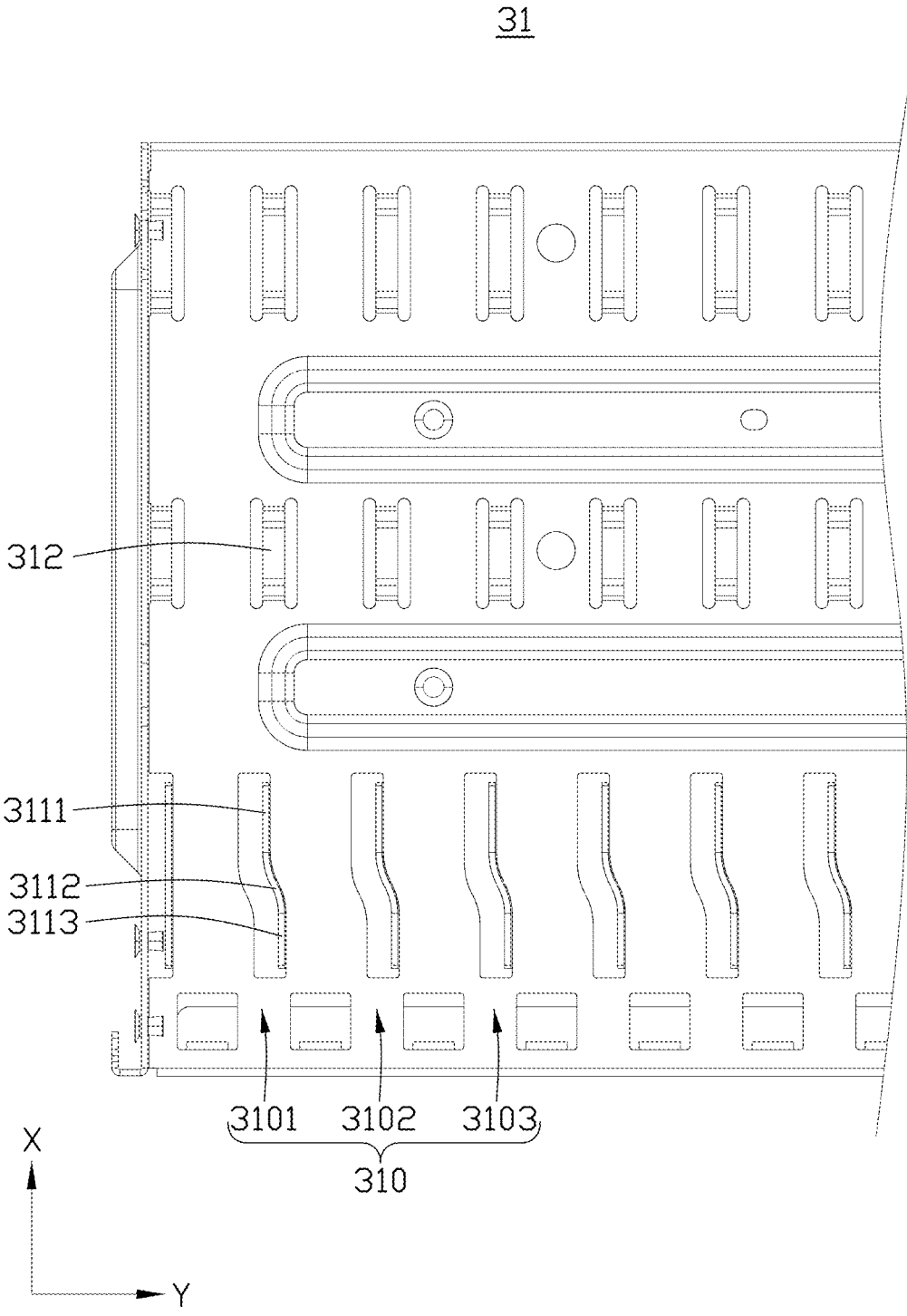
FIG. 3 is a top view of a bottom sheet of the shelf shown in FIG. 2.

As shown in FIG. 2 and FIG. 3, in some embodiments, each division sheet 311 includes a first section 3111, a second section 3112, and a third section 3113 in sequence. The first section 3111 and the third section 3113 are parallel but not aligned in the direction X. An angle between the second section 3112 and the first section 3111 is an obtuse angle, and an angle between the second section 3112 and the third section 3113 is an obtuse angle. For each two adjacent division sheets 311, the first section 3111 of one division sheet 311 and the third section 3113 of another adjacent one division sheet 311 are used for limiting one carrier 40 therein between.

For example, the adjacent three division sheets 311 become a group 310. The first one of these three division sheets 311 in the second direction Y is defined as a first unit 3101, and the middle one is defined as second unit 3102, and the last one is defined as a third unit 3103. The third section 3113 from the first unit 3101 and the first section 3111 from the second unit 3102 are used for limiting one carrier 40; the third section 3113 from the second unit 3102 and the first section 3111 from the third unit 3103 are used for limiting another carrier 40. Thus, one group 310 can limit two carriers 40. The reason for this design is because the distance between two adjacent third sections 3113 is larger than the width of the carrier 40, which makes it easier to insert carriers 40 into the shelf 30.

Due to tolerances in the manufacturing and assembly process of the carrier 40, sometimes there is a gap between the carrier 40 and the connector 22, so during transportation, vibrations may cause the hard drive 41 to separate from the connector 22, causing the hard drive 41 to become unreadable.

To solve the problem mentioned above, as shown in FIG. 4 and FIG. 5, in some embodiments, the carrier 40 includes a sliding bracket 42, a shell 43, and a spring 44. The sliding bracket 42 is used for holding a hard drive 41. The sliding bracket 42 is slidably mounted on the shell 43 in the first direction X, so the hard drive 41 can slide in the first direction X. The spring 44 is mounted between the sliding bracket 42 and the shell 43, and the spring 44 is used for pushing the sliding bracket 42. When the carrier 40 is inserted into the shelf 30, the spring 44 pushes the sliding bracket 42 to the connector 22, to ensure the hard drive 41 is connected to the connector 22, eliminating the gap between the hard drive 41 and the connector 22.

Figure 5:
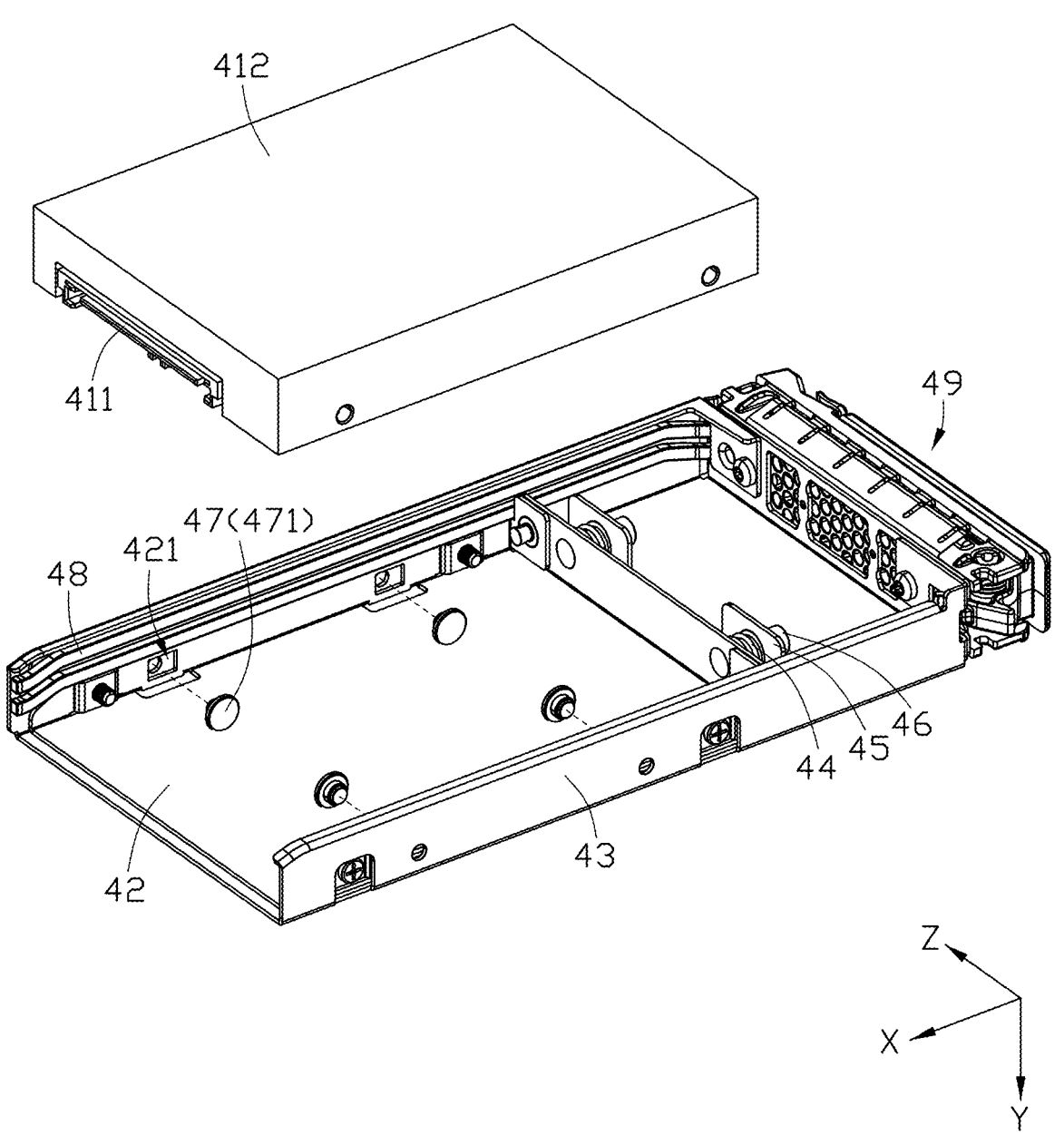
FIG. 5 is an exploded view of the carrier and the hard drive shown in FIG. 4.
Figure 6:
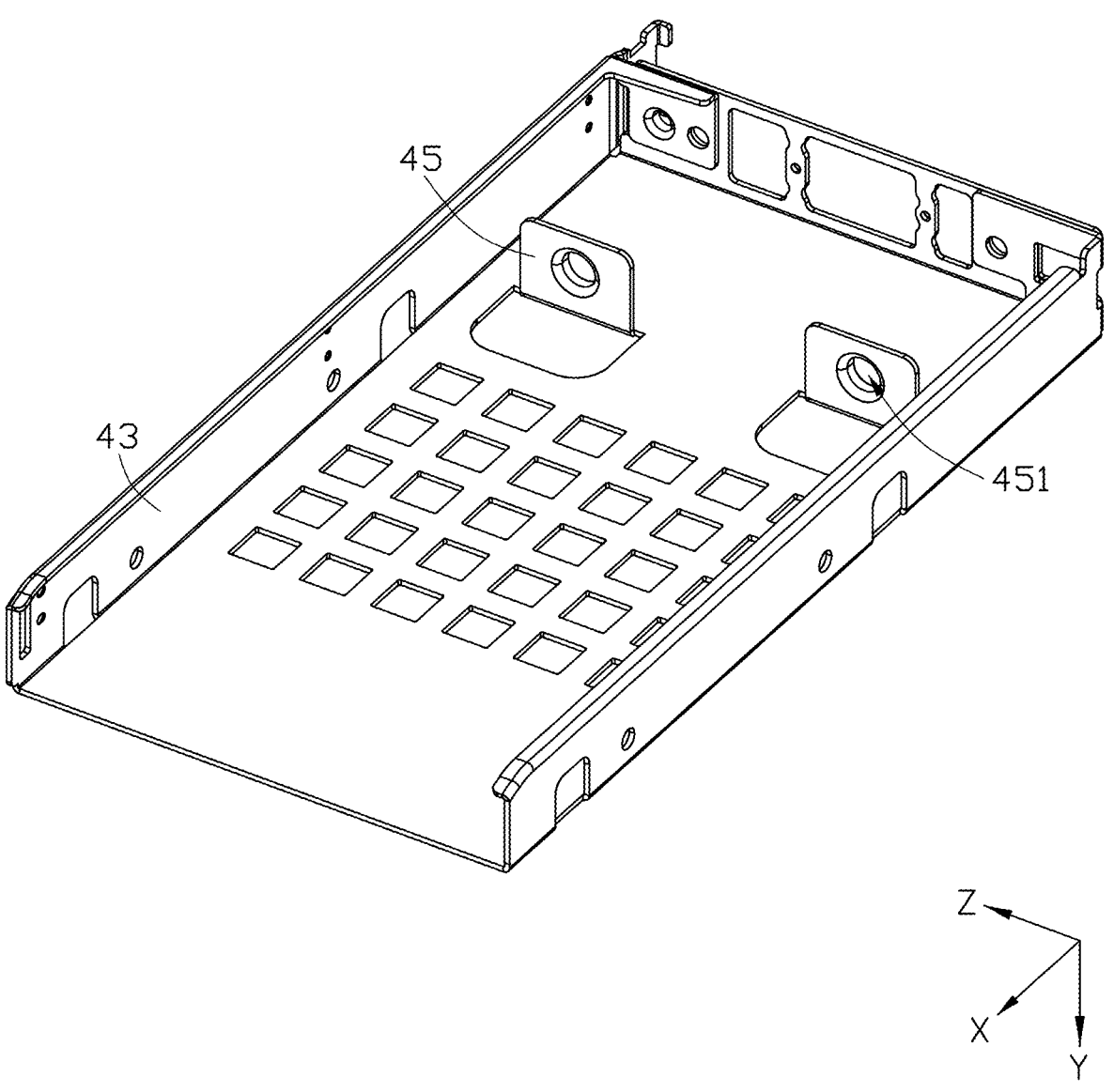
FIG. 6 is an isometric view of a shell of the carrier shown in FIG. 5.

As shown in FIG. 5 and FIG. 6, in some embodiments, the carrier 40 further includes a sheet wall 45 and a cylinder 46. The cylinder 46 is mounted on the sliding bracket 42 towards the sheet wall 45. The sheet wall 45 is in the shell 43. The sheet wall 45 has a guiding hole 451, and the cylinder 46 extends through the guiding hole 451 and the spring 44. The cylinder 46 and the guiding hole 451 are used for guiding the movement of the sliding bracket 42.

In some embodiments, the sheet wall 45 is formed on the shell 43 by bending, thereby facilitating the forming of the sheet wall 45. In some other embodiments, the sheet wall 45 can also be fixed on the shell 43 by welding.

In some embodiments, the cylinder 46 is riveted to the sliding bracket 42.

In some embodiments, the spring 44 can be replaced with a pair of mutually repelling magnets.

As shown in FIG. 5 and FIG. 6, in some embodiments, the carrier 40 further includes a limiting piece 47. The limiting piece 47 is used for limiting the movement of the sliding bracket 42 in the first direction X.

In some embodiments, the limiting piece 47 is a pin 471. The pin 471 is mounted on the shell 43. The sliding bracket 42 has a pin groove 421, and the length of the pin groove 421 extends in the first direction X. The pin 471 extends through the pin groove 421, to limit the movement of the sliding bracket 42 in the first direction X.

In some embodiments, the pin 471 is riveted to the shell 43. There are two pins 471 and two pin grooves 421 located on both sides of the sliding bracket 42.

In some other embodiments, the limiting piece 47 is a screw (not shown in FIGs), and the screw is mounted on the cylinder 46. The screw is larger than the guiding hole 451, so the screw cannot pass through the guiding hole 451, to limit the movement of the sliding bracket 42 in the first direction X.

Figure 4:
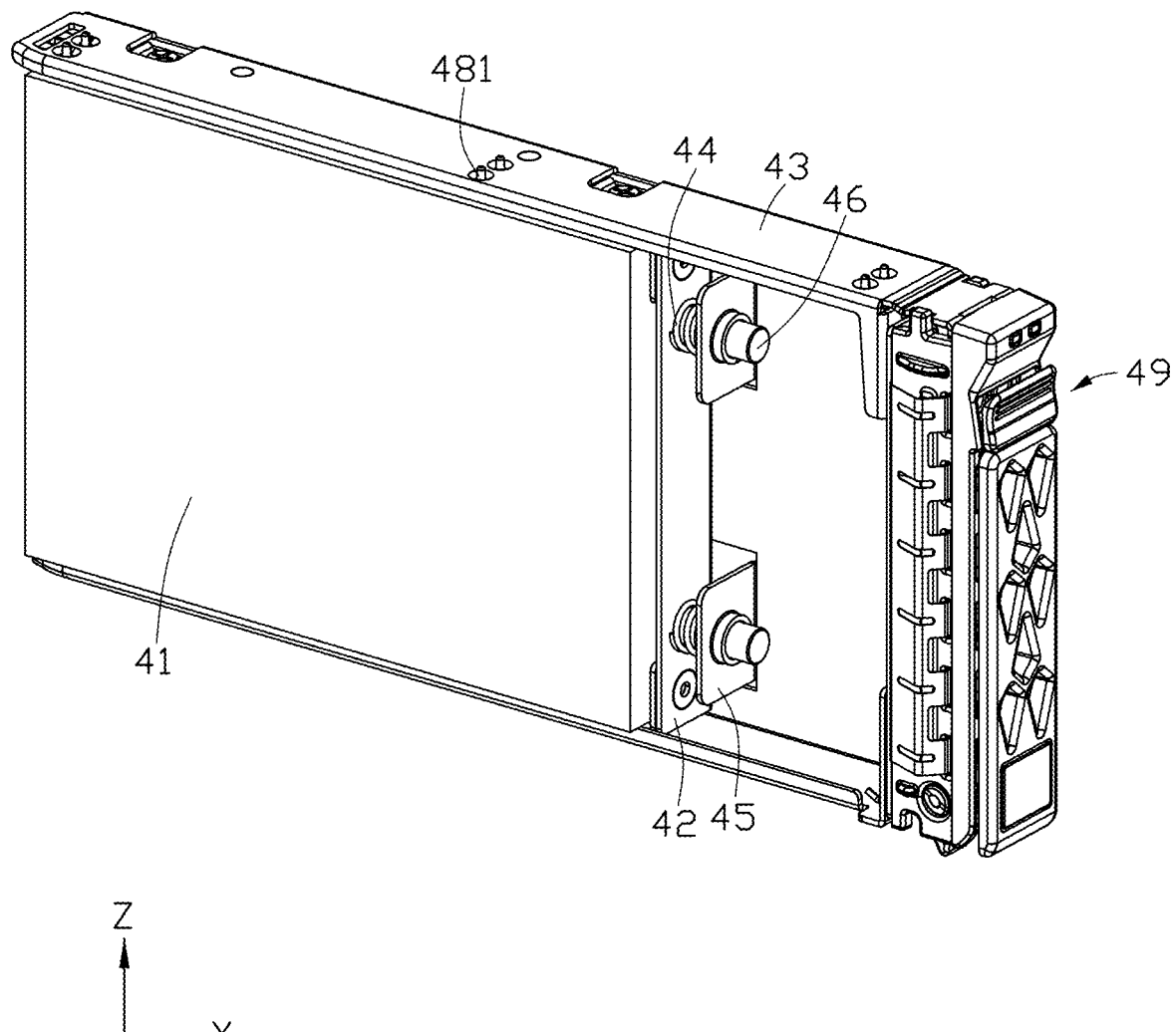
FIG. 4 is an isometric view of a carrier carrying a hard drive of the server shown in FIG. 1.

As shown in FIG. 1, FIG. 4, and FIG. 5, in some embodiments, the carrier 40 further includes at least one heat dissipation strip 48. The heat dissipation strip 48 is inside the shell 43 and contact the hard drive 41 and the shell 43. The heat dissipation strip 48 has at least one thermal conductive column 481. The thermal conductive column 481 is against the top sheet 32 when the carrier 40 is inserted into the shelf 30, so the heat of the hard drive 41 can be conducted to the shelf 30, which helps heat dissipation of the hard drive 41.

In some embodiments, there are two heat dissipation strips 48.

Figure 7:
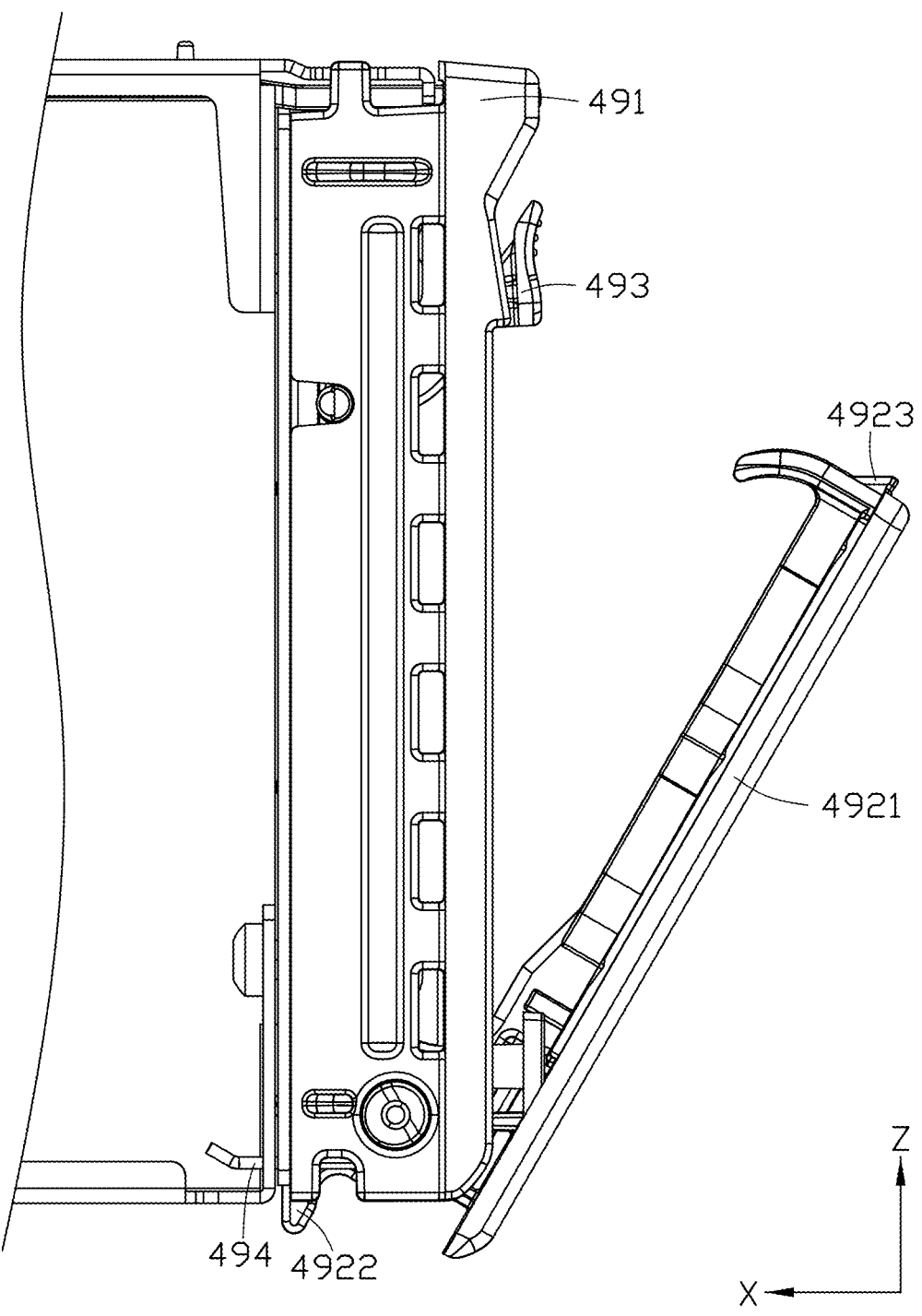
FIG. 7 is a top view of a handle and a frame of the carrier shown in FIG. 5, showing the handle is released from the frame.
Figure 8:
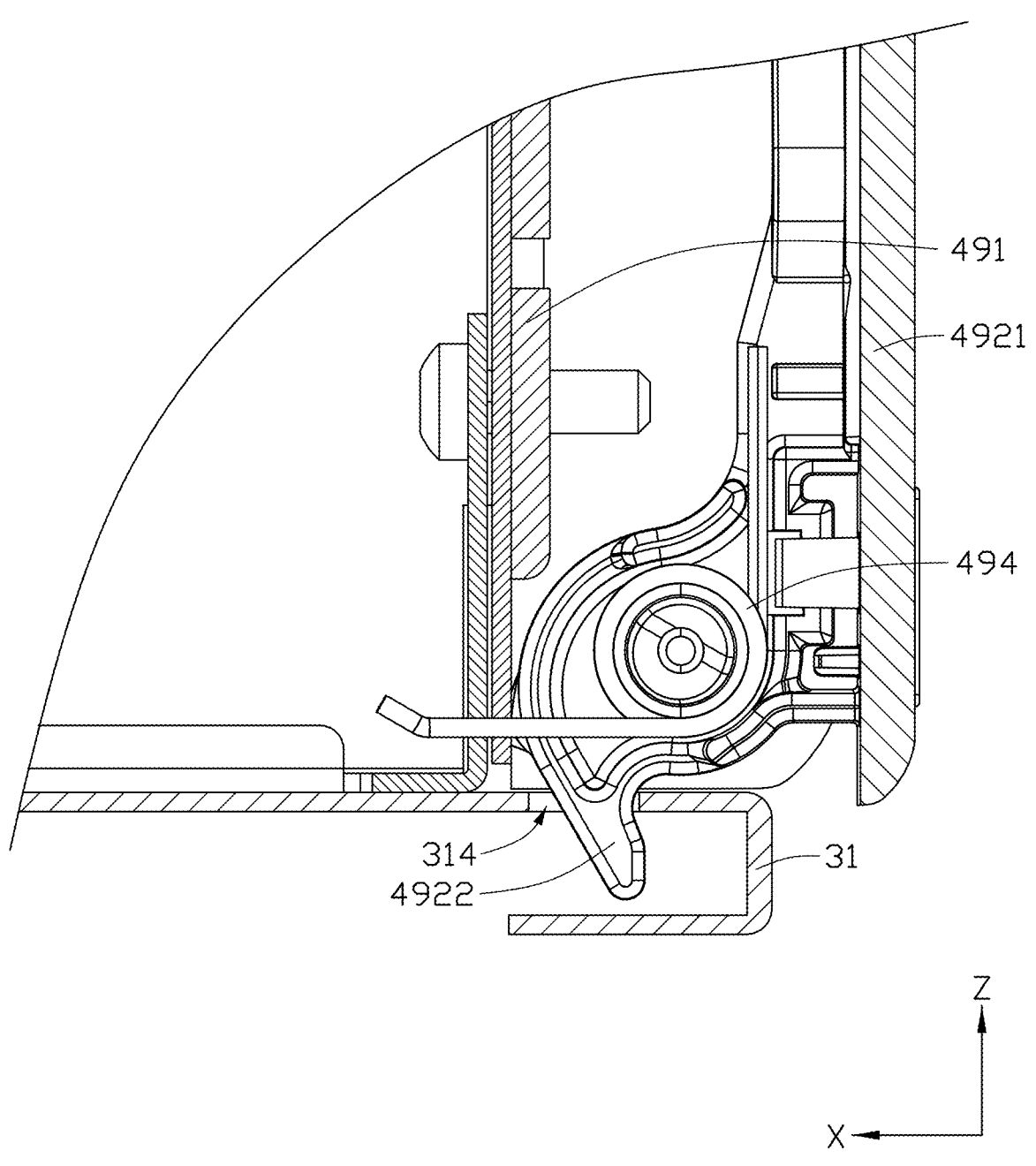
FIG. 8 is a top view of the handle and the frame shown in FIG. 7, showing the carrier is inserted into the shelf.

As shown in FIG. 7 and FIG. 8, in some embodiments, the bottom sheet 31 has a plurality of locking slots 314. The carrier 40 further includes a locking component 49. The locking component 49 includes a frame 491 and a handle 4921. The frame 491 is mounted on the shell 43, and the handle 4921 is rotatably mounted on the frame 491. The handle 4921 is used for catching the carrier 40 by users. The handle 4921 has a hook 4922. After the carrier 40 is inserted into the shelf 30, the handle 4921 should rotate to the frame 491 to hide, and in the meantime, the hook 4922 is inserted into the locking slot 314, as shown in FIG. 8, to position the carrier 40 to the shelf 30. When the carrier 40 needs to be taken out from the shelf 30, users rotate the handle 4921 away from the frame 491 to catch the handle 4921 and pull the handle 4921 to pull the carrier 40 out of the shelf 30, as shown in FIG. 7. During the handle 4921 rotating away from the frame 491, the hook 4922 moves out of the locking slot 314, to release the carrier 40 from the shelf 30.

As shown in FIG. 1, FIG. 7, and FIG. 8, in some embodiments, the locking component 49 further includes a button 493. The button 493 is rotatably mounted to the frame 491. The handle 4921 has a buckle 4923 away from the hook 4922. When users rotate the handle 4921 to the frame 491, the button 493 buckles the buckle 4923, to lock the handle 4921 to the frame 491, keeping the hook 4922 in the locking slot 314.

In some embodiments, there is a torsion spring 494 connected to the handle 4921 and the frame 491, and the torsion spring 494 is used for rotating the handle 4921 away from the frame 491, so when users press the button 493, the handle 4921 pops up automatically.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A carrier for carrying a hard drive comprising:

a shell;

a sliding bracket placed in the shell and slidable relative to the shell, and the sliding bracket being configured for holding the hard drive; and a spring connected to the shell and the sliding bracket, and the spring being configured for pushing the sliding bracket, wherein when the carrier is inserted into a cabinet, the spring pushes the sliding bracket to a connector of the cabinet to connect the hard drive to the connector;

wherein the shell comprises a sheet wall and the sliding bracket comprises a cylinder, the spring is mounted between the sliding bracket and the sheet wall, the sheet wall defines a guiding hole, the cylinder extends through the spring and the guiding hole, the cylinder and the guiding hole are configured for guiding the sliding bracket.

2. The carrier of claim 1 further comprises a pin, the sliding bracket defines a pin groove, the pin extends through the pin groove, the pin groove extends along a movement of the sliding bracket, the pin is slidable in the pin groove, the pin groove and the pin are configured for limiting the movement of the sliding bracket relative to the shell.

3. The carrier of claim 1 further comprises a heat dissipation strip, the heat dissipation strip is located on the shell and is inside the shell, the heat dissipation strip is configured for contacting the hard drive to absorb heat of the hard drive.

4. A cabinet for accommodating a server comprising:

a chassis configured for accommodating a circuit board with a plurality of connectors;

a shelf placed in the chassis; and a plurality of carriers insertable into the shelf, each of the plurality of carriers comprising:

a shell;

a sliding bracket placed in the shell and being slidable relative to the shell, and the sliding bracket being configured for holding a hard drive; and a spring connected to the shell and the sliding bracket, and the spring being configured for pushing the sliding bracket, wherein each of the plurality of connectors is configured for connecting the hard drive held in each of the plurality of carriers, when one of the plurality of carriers is inserted into the shelf, the spring pushes the sliding bracket to the connector, to connect the hard drive to the connector;

wherein the shell comprises a sheet wall and the sliding bracket comprises a cylinder, the spring is mounted between the sliding bracket and the sheet wall, the sheet wall defines a guiding hole, the cylinder extends through the spring and the guiding hole, the cylinder and the guiding hole are configured for guiding the sliding bracket.

5. The cabinet of claim 4, wherein the carrier further comprises a pin, the sliding bracket defines a pin groove, the pin extends through the pin groove, the pin groove extends along a movement of the sliding bracket, the pin is slidable in the pin groove, the pin groove and the pin are configured for limiting the movement of the sliding bracket relative to the shell.

6. The cabinet of claim 4, wherein the carrier further comprises a heat dissipation strip, the heat dissipation strip is located on the shell and is inside the shell, the heat dissipation strip is configured for contacting the hard drive to absorb heat of the hard drive.

7. The cabinet of claim 4, wherein the shelf comprises a plurality of division sheets, one of the plurality of carriers is located between each adjacent two ones of the plurality of division sheets, and the plurality of division sheets are configured for guiding the carriers to insert into the shelf.

8. The cabinet of claim 7, wherein each of the plurality of division sheets comprises a first section, a second section and a third section in sequence, the first section is parallel to the third section, an angle between the second section and the first section is an obtuse angle, and an angle between the second section and the third section is also an obtuse angle; for each adjacent two ones of the plurality of division sheets, the third section of one division sheet and the first section of adjacent one division sheet are configured for limit one of the plurality of the carriers.

9. The cabinet of claim 4, wherein the shelf defines a plurality of locking slots, each of the plurality of carriers further comprises a locking component, the locking component comprises a frame and a handle, the frame is located on the shell, the handle is rotatably mounted on the frame, the handle comprises a hook, each of the plurality of locking slots is configured for accommodating each of the hooks, when one of the carriers is inserted into the shelf and the handle is rotated to the frame, the hook inserts into the locking slot to lock the carrier, when the handle is rotated away from the frame, the hook moves out of the locking slot to allow the carrier to be removed from the shelf.

10. The cabinet of claim 9, wherein the locking component further comprises a button, the button is located on the frame, the handle further comprises a buckle, when the handle is rotated to the frame, the button buckles the buckle to position the handle to the frame, when the button is pressed, the button releases the buckle.

11. A server comprising:

a circuit board with a plurality of connectors; and a cabinet, the cabinet comprising:

a chassis configured for accommodating the circuit board;

a shelf placed in the chassis; and a plurality of carriers insertable into the shelf, each of the plurality of carriers comprising:

a shell;

a sliding bracket placed in the shell and being slidable relative to the shell, and the sliding bracket being configured for holding a hard drive; and a spring connected to the shell and the sliding bracket, and the spring being configured for pushing the sliding bracket, wherein each of the plurality of connectors is configured for connecting the hard drive held in each of the plurality of carriers, when one of the plurality of carriers is inserted into the shelf, the spring pushes the sliding bracket to the connector, to connect the hard drive to the connector;

wherein the shell comprises a sheet wall and the sliding bracket comprises a cylinder, the spring is mounted between the sliding bracket and the sheet wall, the sheet wall defines a guiding hole, the cylinder extends through the spring and the guiding hole, the cylinder and the guiding hole are configured for guiding the sliding bracket.

12. The server of claim 11, wherein the carrier further comprises a pin, the sliding bracket defines a pin groove, the pin extends through the pin groove, the pin groove extends along a movement of the sliding bracket, the pin is slidable in the pin groove, the pin groove and the pin are configured for limiting the movement of the sliding bracket relative to the shell.

13. The server of claim 11, wherein the carrier further comprises a heat dissipation strip, the heat dissipation strip is located on the shell and is inside the shell, the heat dissipation strip is configured for contacting the hard drive to absorb heat of the hard drive.

14. The server of claim 11, wherein the shelf comprises a plurality of division sheets, one of the plurality of carriers is located between each adjacent two ones of the plurality of division sheets, and the plurality of division sheets are configured for guiding the carriers to insert into the shelf.

15. The server of claim 14, wherein each of the plurality of division sheets comprises a first section, a second section and a third section in sequence, the first section is parallel to the third section, an angle between the second section and the first section is an obtuse angle, and an angle between the second section and the third section is also an obtuse angle; for each adjacent two ones of the plurality of division sheets, the third section of one division sheet and the first section of adjacent one division sheet are configured for limit one of the plurality of the carriers.

16. The server of claim 11, wherein the shelf defines a plurality of locking slots, each of the plurality of carriers further comprises a locking component, the locking component comprises a frame and a handle, the frame is located on the shell, the handle is rotatably mounted on the frame, the handle comprises a hook, each of the plurality of locking slots is configured for accommodating each of the hooks, when one of the carriers is inserted into the shelf and the handle is rotated to the frame, the hook inserts into the locking slot to lock the carrier, when the handle is rotated away from the frame, the hook moves out of the locking slot to allow the carrier to be removed from the shelf.

17. The server of claim 16, wherein the locking component further comprises a button, the button is located on the frame, the handle further comprises a buckle, when the handle is rotated to the frame, the button buckles the buckle to position the handle to the frame, when the button is pressed, the button releases the buckle.

* * * * *